US011264267B2

(12) United States Patent
Miyadate et al.

(10) Patent No.: US 11,264,267 B2
(45) Date of Patent: Mar. 1, 2022

(54) APPARATUS FOR PROCESSING SUBSTRATE AND METHOD FOR DETECTING A PRESENCE OF A FOCUS RING ON A STAGE

(71) Applicant: Tokyo Electron Limited, Tokyo (JP)

(72) Inventors: Takaharu Miyadate, Miyagi (JP); Takashi Taira, Miyagi (JP); Kenji Nagai, Miyagi (JP); Hideaki Nagasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 101 days.

(21) Appl. No.: 16/813,855

(22) Filed: Mar. 10, 2020

(65) Prior Publication Data
US 2020/0303235 A1    Sep. 24, 2020

(30) Foreign Application Priority Data

Mar. 22, 2019  (JP) .............................. JP2019-055024

(51) Int. Cl.
*H01L 21/68* (2006.01)
*H01L 21/687* (2006.01)
*H01L 21/67* (2006.01)
*H01L 21/677* (2006.01)

(52) U.S. Cl.
CPC .. *H01L 21/68785* (2013.01); *H01L 21/67028* (2013.01); *H01L 21/67742* (2013.01); *H01L 21/67745* (2013.01)

(58) Field of Classification Search
CPC ......... H01L 21/67028; H01L 21/67109; H01L 21/67259; H01L 21/67742; H01L 21/67745; H01L 21/6831; H01L 21/68735; H01L 21/68785
See application file for complete search history.

(56) References Cited

U.S. PATENT DOCUMENTS

| | | | |
|---|---|---|---|
| 2010/0206482 A1* | 8/2010 | Matsudo | G01J 5/0806 156/345.27 |
| 2017/0084426 A1* | 3/2017 | Albarede | H01J 37/32009 |
| 2017/0140905 A1* | 5/2017 | Mihaylov | H01J 37/32972 |
| 2018/0261481 A1* | 9/2018 | Eto | G01K 11/3213 |
| 2019/0362950 A1* | 11/2019 | Manne | H01J 37/32458 |

FOREIGN PATENT DOCUMENTS

JP    2010-045071 A    2/2010

\* cited by examiner

*Primary Examiner* — Mohammed Shamsuzzaman
(74) *Attorney, Agent, or Firm* — Xsensus LLP

(57) ABSTRACT

A substrate processing apparatus includes a stage, a light source, an optical assembly, a light receiver, and controller circuitry. The stage includes a first placing surface on which a substrate is to be placed, and a second placing surface that surrounds the first placing surface and on which a focus ring is to be placed. The optical assembly focuses light from the light source on a lower surface position, which is a position of a lower surface of the focus ring placed on the second placing surface. The light receiver receives light from the lower surface position. The controller circuitry detects at least one of a presence and an absence of the focus ring on the second placing surface, based on light received by the light receiver.

15 Claims, 9 Drawing Sheets

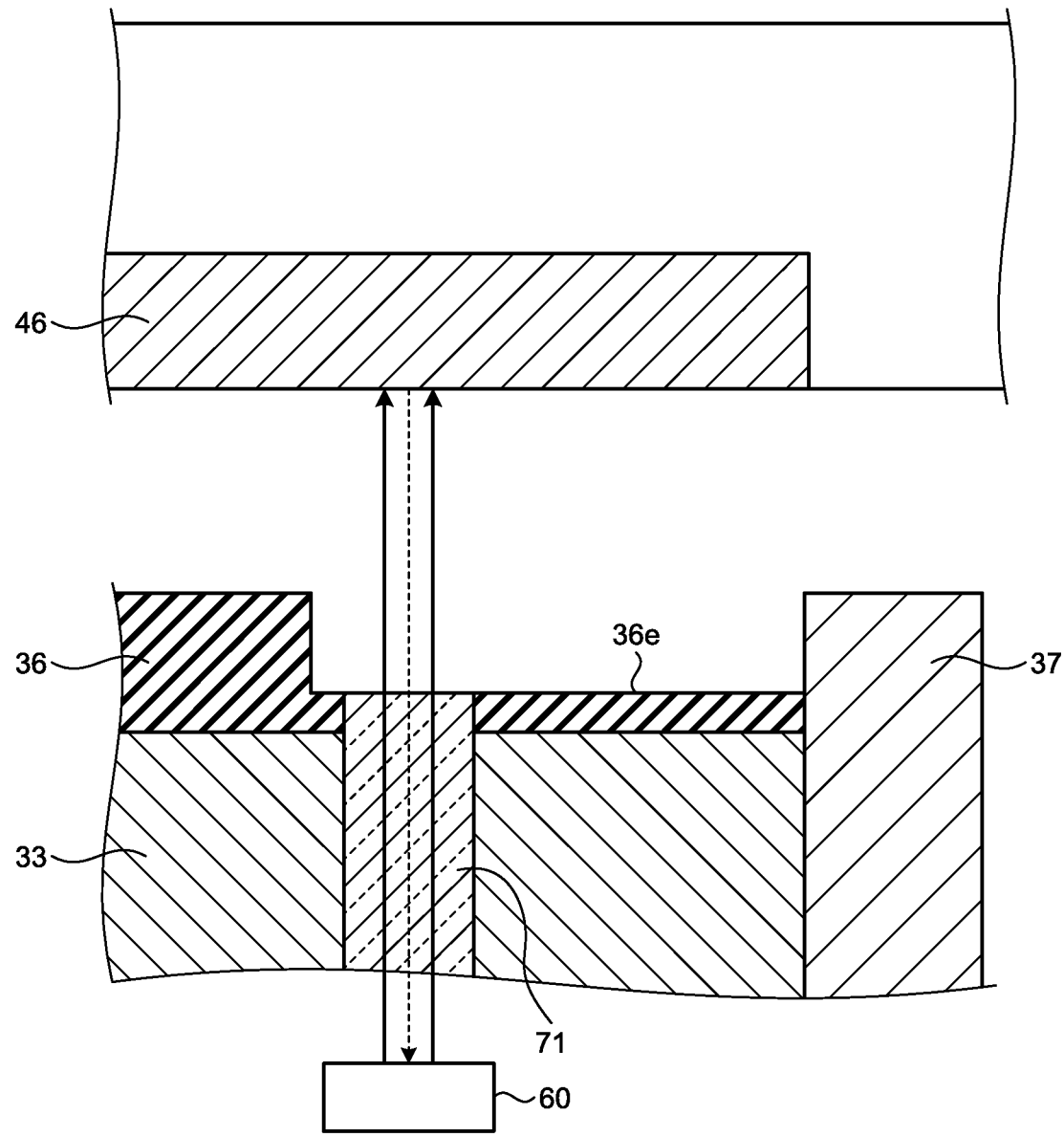

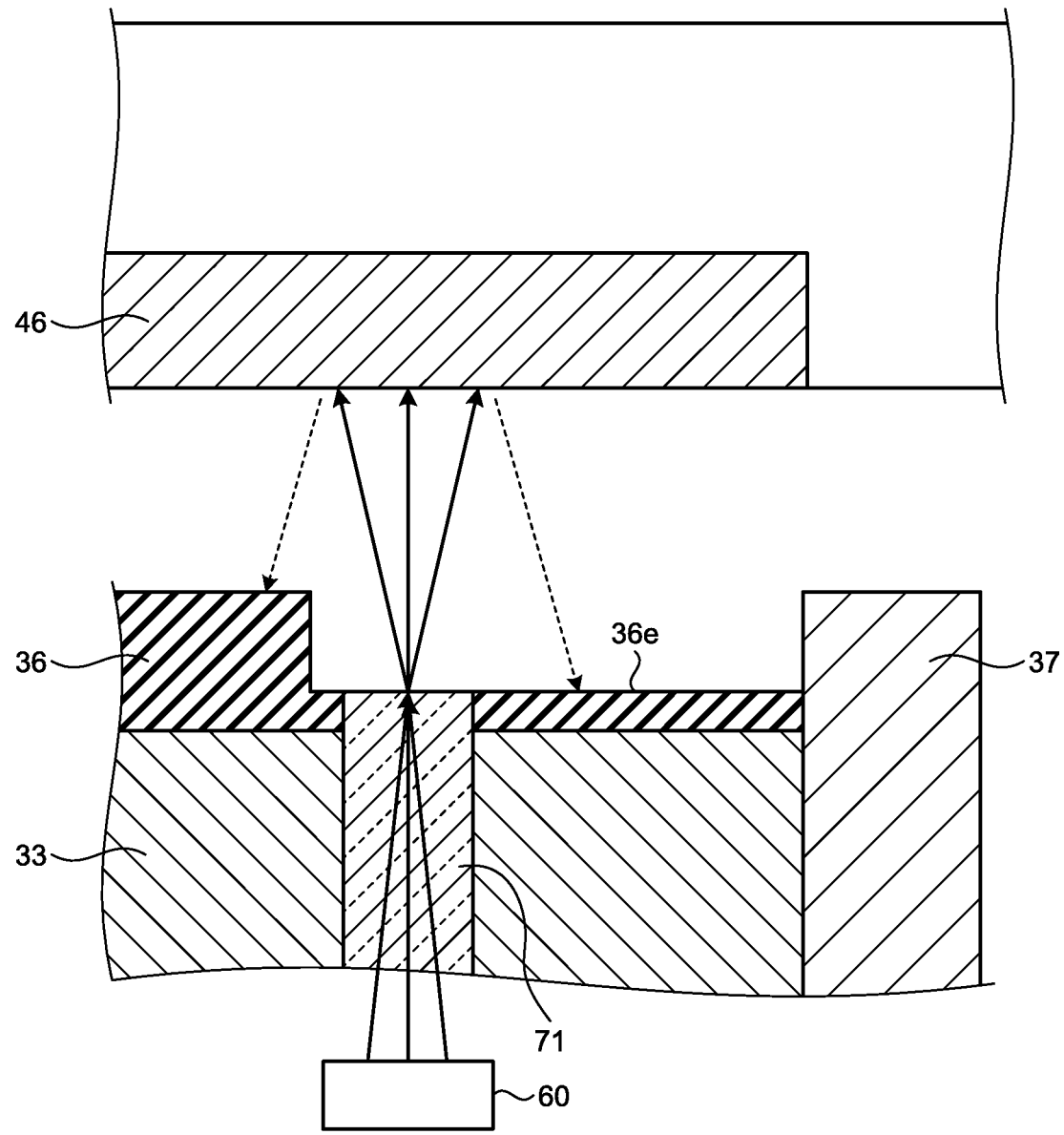

(A)

(B)

(A)

(B)

APPARATUS FOR PROCESSING SUBSTRATE AND METHOD FOR DETECTING A PRESENCE OF A FOCUS RING ON A STAGE

CROSS-REFERENCE TO RELATED APPLICATION

The present application claims priority to and incorporates by reference the entire contents of Japanese Patent Application No. 2019-055024 filed in Japan on Mar. 22, 2019.

FIELD

Present disclosure relates to a substrate processing apparatus and a method for detecting a presence and an absence of a focus ring on a stage.

BACKGROUND

A detection device including a detection unit that detects whether a substrate is attracted onto an electrostatic chuck, which attracts a substrate by electrostatic attraction force, has been proposed (Japanese Laid-open Patent Publication No. 2010-45071).

The present disclosure provides a technology for detecting the presence and absence of a focus ring disposed on a stage.

SUMMARY

According to one aspect of the disclosure, an apparatus for processing a substrate is provided. The apparatus includes a stage, a light source, an optical assembly, a light receiver, and a controller. The stage includes a first placing surface on which a substrate is to be placed and a second placing surface that surrounds the first placing surface and on which a focus ring is to be placed. The optical assembly adjustably focuses light from the light source substantially on a lower surface position, which is a position of a lower surface of the focus ring placed on the second placing surface. The light receiver receives light from the lower surface position. The controller circuitry is configured to detect at least one of a presence and an absence of the focus ring on the second placing surface, based on the light received by the light receiver.

According to another aspect, a controller in an apparatus for processing a substrate includes circuitry configured to control an optical assembly to focus light from a light source substantially on a lower surface portion of a focus ring once disposed on a second placing surface of a stage, the second placing surface surrounding a first placing surface of the stage on which a substrate is to be placed; receive light that returns through an optical channel structure disposed in a through hole formed in the stage, the through hole being opened to the second placing surface; and detect at least one of a presence of the focus ring and an absence of the focus ring on the second placing surface, based on the light received.

According to another aspect of the disclosure, a method for detecting presence of a focus ring on a stage is provided. The method includes: focusing light from a light source on a lower surface position that is a position of a lower surface of a focus ring placed on a stage, the stage including a first placing surface on which a substrate is to be placed and a second placing surface that surrounds the first placing surface and on which the focus ring is to be placed; receiving light from the lower surface position; and detecting at least one of a presence and an absence of the focus ring on the second placing surface, based on the light being received.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein:

FIG. 3A is a diagram for explaining a state when straight light is reflected by a shower head;

FIG. 3C is a diagram for explaining a state when light emitted from a sensor is reflected by a shower head in the substrate processing apparatus according to the embodiment;

DESCRIPTION OF EMBODIMENTS

Exemplary embodiments will be explained below in detail with reference to the accompanying drawings. The embodiments explained below are not limiting. The embodiments can be appropriately combined as far as processes do not contradict with each other. In the present specification and drawings, the same reference signs are used for substantially the same components, and overlapping explanations are omitted. In the following explanation, a direction from a wafer (substrate) on a stage toward a stage is referred to as downward direction, and a direction opposite to the downward direction is referred to as upward direction.

Figure 1:
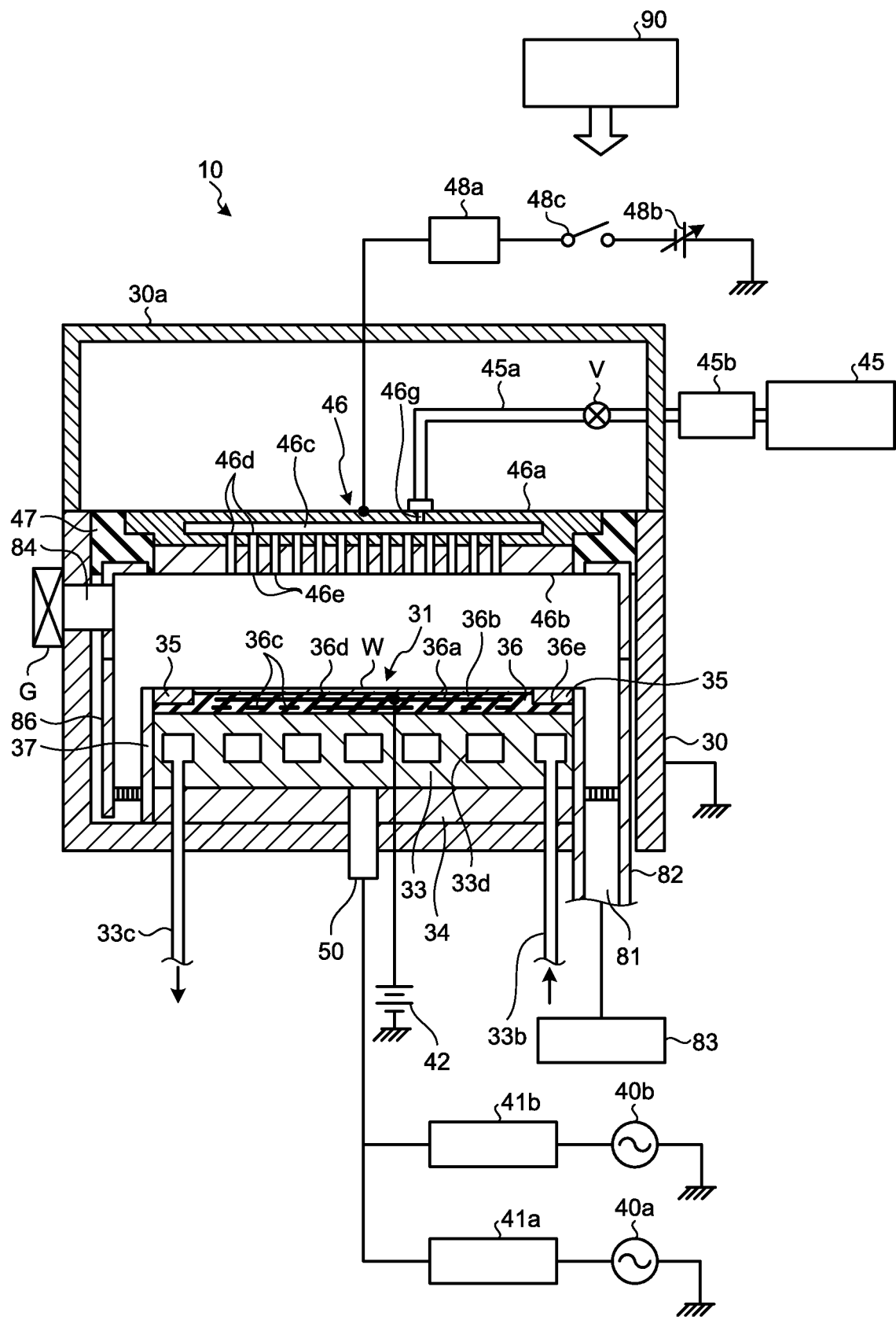
FIG. 1 is a diagram illustrating an exemplary configuration of a substrate processing apparatus according to an embodiment.

FIG. 1 is a diagram schematically illustrating a substrate processing apparatus 10 according to an embodiment. The substrate processing apparatus 10 includes a processing container 30 that is configured airtight and that is electrically connected to ground potential. The processing container 30 is formed in a cylindrical shape, and is made of aluminum and the like the top face of which is coated with an anodized film. The processing container 30 defines a processing space in which plasma is generated. A stage 31 horizontally supports a wafer W and is accommodated in the processing container 30.

The stage 31 is formed in a substantially columnar shape, and includes a base 33 and an electrostatic chuck 36.

For example, the base 33 is made of conductive metal such as aluminum. The base 33 functions as a lower electrode. The base 33 is supported by a supporting table 34 being an insulator. The supporting table 34 is installed in the bottom of the processing container 30.

The upper surface of the electrostatic chuck 36 has a flat disc shape, and the upper surface establishes a first placing surface 36d on which the wafer W is placed. The electrostatic chuck 36 is provided at the center of the stage 31 in a plan view. The electrostatic chuck 36 includes an electrode 36a and an insulator 36b. The electrode 36a is provided inside the insulator 36b, and a direct current power source 42 is connected to the electrode 36a. The electrostatic chuck 36 is configured such that the wafer W is attracted by Coulomb force, when a direct current voltage is applied to the electrode 36a from the direct current power source 42. Moreover, a heater 36c is provided inside the insulator 36b of the electrostatic chuck 36. Electric power is supplied to the heater 36c via a power feeding mechanism, which will be described below, and the heater 36c controls the temperature of the wafer W.

The upper outer periphery of the stage 31 forms a second placing surface 36e. The upper surface of the second placing surface 36e surrounds the first placing surface 36d, and is formed at a position lower than the first placing surface 36d. A "focus ring" 35 made of, for example, single crystal silicon is disposed on the second placing surface 36e. Moreover, an inner wall member 37 formed in a cylindrical shape and made of, for example, quartz and the like is provided so as to surround the periphery of the stage 31 and the supporting table 34.

A power feeding rod 50 is connected to the base 33. A first radio frequency (RF) power source 40a is connected to the power feeding rod 50 via a first matching device 41a. Moreover, a second RF power source 40b is connected to the power feeding rod 50 via a second matching device 41b. The first RF power source 40a is a power source for generating plasma. The first RF power source 40a is configured such that a high frequency electric power with a predetermined frequency is supplied to the base 33 of the stage 31 from the first RF power source 40a. Moreover, the second RF power source 40b is a power source for pulling in ions (for bias). The second RF power source 40b is configured such that a high frequency electric power with a predetermined frequency lower than that of the first RF power source 40a is supplied to the base 33 of the stage 31 from the second RF power source 40b.

A coolant flow channel 33d is formed inside the base 33. A coolant inlet pipe 33b is connected to one of the ends of the coolant flow channel 33d, and a coolant outlet pipe 33c is connected to the other end. The substrate processing apparatus 10 is configured so as to be able to control the temperature of the stage 31, by circulating coolant such as cool water, in the coolant flow channel 33d. The substrate processing apparatus 10 may also be configured so as to be able to individually control the temperature of the wafer W and the focus ring 35, by separately providing a coolant flow channel in the base 33 for each of the areas in which the wafer W and the focus ring 35 are placed. Moreover, the substrate processing apparatus 10 is configured so as to be able to individually control the temperature, by supplying heat transfer gas to the reverse face side of the wafer W and the focus ring 35. Thus, a gas supply pipe for supplying heat transfer gas (backside gas) such as helium gas may be provided on the reverse face of the wafer W, so as to penetrate through the stage 31 and the like. The gas supply pipe is connected to a gas supply source. With these configurations, the wafer W attracted and held by the electrostatic chuck 36 on the upper surface of the stage 31 is controlled to a predetermined temperature.

A shower head 46 that functions as an upper electrode is provided above the stage 31 so as to face the stage 31 in parallel. The shower head 46 and the stage 31 function as a pair of electrodes (upper electrode and lower electrode).

The shower head 46 is provided on a top wall portion of the processing container 30. The shower head 46 includes a main body part 46a and an upper top plate 46b that forms an electrode plate. The shower head 46 is supported above the processing container 30 via an insulation member 47. For example, the main body part 46a is made of a conductive material such as aluminum the top face of which is coated with an anodized film. The lower portion of the main body part 46a is configured so as to be able to detachably support the upper top plate 46b. The upper top plate 46b is made of, for example, silicon.

A gas diffusion chamber 46c is provided inside the main body part 46a. A large number of gas passing holes 46d are formed on the bottom part of the main body part 46a so as the gas passing holes 46d are placed below the gas diffusion chamber 46c. Moreover, on the upper top plate 46b, gas introduction holes 46e are provided so as to penetrate through the upper top plate 46b in the thickness direction, and to overlap with the respective gas passing holes 46d described above. With such a configuration, the processing gas supplied to the gas diffusion chamber 46c is dispersed and supplied in a shower-like manner into the processing container 30 via the gas passing hole 46d and the gas introduction hole 46e.

A gas introduction inlet 46g for introducing the processing gas to the gas diffusion chamber 46c is formed on the main body part 46a. An end of a gas supply pipe 45a is connected to the gas introduction inlet 46g. A processing gas supply source 45 for supplying processing gas is connected to the other end of the gas supply pipe 45a. A mass flow controller (MFC) 45b and an opening and closing valve V are provided on the gas supply pipe 45a in this order from the upstream side. A processing gas for plasma etching is supplied to the gas diffusion chamber 46c from the processing gas supply source 45 via the gas supply pipe 45a. The processing gas is then dispersed and supplied in a shower-like manner into the processing container 30 from the gas diffusion chamber 46c via the gas passing holes 46d and the gas introduction holes 46e.

A variable direct current power source 48b is electrically connected via a low pass filter (LPF) 48a to the shower head 46 that serves as the upper electrode as described above. The variable direct current power source 48b is configured so that power can be turned ON and OFF by an on/off switch 48c. A controller 90, which will be described below, controls the electric current and voltage of the variable direct current power source 48b and the turning ON and OFF of the on/off switch 48c. As will be described below, when high frequency is applied to the stage 31 from the first RF power source 40a and the second RF power source 40b, and plasma is generated in the processing space, the on/off switch 48c is turned ON by the controller 90 according to the needs, and a predetermined direct current voltage is applied to the shower head 46 serving as the upper electrode.

Moreover, a grounding conductor 30*a* formed in a cylindrical shape is provided so as to extend upward from the side wall of the processing container 30 above the height of the shower head 46. The grounding conductor 30*a* has a top wall extending across a cylindrical part.

An exhaust port 81 is formed on the bottom part of the processing container 30, and an exhaust device 83 is connected to the exhaust port 81 via an exhaust pipe 82. The exhaust device 83 includes a vacuum pump. The exhaust device 83 is configured such that the pressure inside the processing container 30 can be reduced to a predetermined vacuum degree, by operating the vacuum pump.

A gate 84 used for carrying-in and carrying-out the wafer W is provided on the side wall of the processing container 30. A gate valve G for opening and closing the gate 84 is provided on the gate 84. As illustrated in FIG. 1, the gate 84 is connected to a vacuum transfer chamber via the gate valve G while airtightness is maintained. Consequently, the wafer W can be carried in and carried out from the vacuum transfer chamber in a vacuum atmosphere.

A depo shield 86 is provided along the inner wall surface at the inside of the processing container 30. The depo shield 86 prevents an etching byproduct (depo) from adhering to the processing container 30. The depo shield 86 is detachably configured.

Operation of the substrate processing apparatus 10 configured as above is integrally controlled by the controller 90. For example, the controller 90 is a computer, and controls the units of the substrate processing apparatus 10. The operation of the substrate processing apparatus 10 is integrally controlled by the controller 90. The controller 90 is an information processing device that controls the units of the substrate processing apparatus 10. The specific configuration and functions of the controller 90 are not particularly limited. For example, the controller 90 includes storage, a processing unit, an input and output interface (IO I/F), and a display unit. For example, the storage is any storage device such as hard disk, optical disc, and semiconductor memory element. For example, the controller circuitry is a processor or other circuitry such as a central processing unit (CPU), and/or a micro processing unit (MPU). The display unit is for displaying information and optionally includes at least one of a liquid crystal screen and a touch panel. The processing unit controls the components, or "units" of the substrate processing apparatus 10 via the input and output interface, by reading out and executing a computer program and recipe stored in the storage.

Exemplary Configuration of Detector 60

Figure 2:
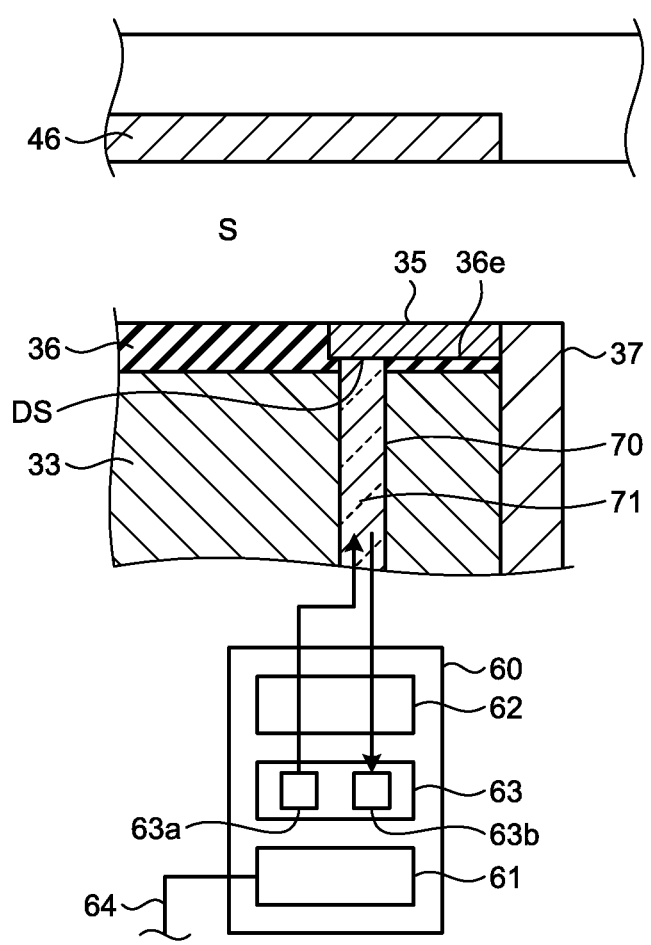
FIG. 2 is a schematic sectional diagram illustrating an exemplary configuration of a part of the substrate processing apparatus according to the embodiment.

FIG. 2 is a schematic sectional diagram illustrating an exemplary configuration of a part of the substrate processing apparatus 10 according to the embodiment. In FIG. 2, an exemplary configuration around a detector 60 disposed in the stage 31 of FIG. 1 is illustrated in an enlarged manner. The sectional diagram in FIG. 2 illustrates a cross section of the substrate processing apparatus 10 at a position different from that in FIG. 1.

As illustrated in FIG. 2, in the stage 31, a through hole 70 penetrates through the electrostatic chuck 36 and the base 33. The through hole 70 is opened on the second placing surface 36*e*. A transmitting member 71 is disposed inside the through hole 70. The transmitting member 71 is made of a material that transmits light emitted from a light source 63*a*, which will be described below. In this context, the transmitting member 71 is an optical channel structure, which is a structural medium in which light propagates. For example, the transmitting member 71 may be sapphire, quartz, and the like. For example, the transmitting member 71 is formed in a substantially columnar shape, and seals the through hole 70 so that a plasma processing space S and the space below the stage 31 do not communicate with each other. The shape of the transmitting member 71 is not limited to the columnar shape. As long as the transmitting member 71 seals the through hole 70, the shape of the transmitting member 71 may also be a truncated cone shape the leading end of which is tapered toward the focus ring 35 side, for example.

The detector 60 is disposed below the through hole 70 and the transmitting member 71 in the axial direction. The detector 60 is disposed at least at one position in the circumferential direction of the stage 31. However, the detector 60 may also be disposed at two or more positions in the circumferential direction of the stage 31.

The detector 60 includes a processing circuit 61, a focus adjuster 62, a sensor 63, and a connector 64. As a point of clarification, although the following description relates to an operation of the detector 60, which includes an optical focusing feature, that "optical focusing" does not suggest that the "focus ring" 35 performs a focusing operation itself. It does not. The term "focus ring" 35 is a term for the annular structure disposed between an inner wall member 37 and electrostatic chuck 36. As discussed below, light from the light source 63*a* may have its light focused on a surface of the focus ring 35, but the focus ring 35 itself is not performing the focusing operation.

The processing circuit 61 is disposed between the sensor 63 and the connector 64. Information on light detected by the sensor 63 is transmitted to the connector 64 via the processing circuit 61.

The focus adjuster 62 focuses the light emitted from the light source 63*a* on the lower surface position, which is a position of the lower surface of the focus ring 35 when the focus ring 35 is placed on the second placing surface 36*e*. For example, the focus adjuster 62 is an optical assembly (e.g., including an objective lens) that focuses the light on a detection surface DS in FIG. 2. Moreover, for example, the focus adjuster 62 focuses the light within a predetermined vertical range with respect to the lower surface position of the focus ring 35 when the focus ring 35 is placed on the second placing surface 36*e*. In this context, "to focus light" (or "focusing light") is synonymous with condensing light. A specific configuration of the focus adjuster 62 is not particularly limited. For example, the focus adjuster 62 can be configured using a focus lens, or a series of lenses. The focal position of light can be determined according to an angle of a traveling direction of light emitted from a light source with respect to the lower surface of the focus ring 35. Consequently, the focal position of light may not be exactly on the lower surface position of the focus ring 35, and may also be close to the lower surface position of the focus ring 35, such as within a predetermined vertical distance from the lower surface position of the focus ring 35. The focus adjuster 62 adjusts the focal position of light, before the detector 60 carries out detection, and while the focus ring 35 is placed on the second placing surface 36*e*. For example, the focus adjuster 62 is adjusted so that the light from the light source 63*a* is focused on the lower surface position of the focus ring 35 placed on the second placing surface 36*e*. In other words, the focus adjuster 62 is adjusted so that the light is ideally focused on the position where the lower surface of the focus ring 35 is disposed when the focus ring 35 is at a fixed position. However, the focus adjuster 62 provides an adequate result as long as the focal point falls within the predetermined vertical distance (e.g., +/−1 mm, 2 mm, 3 mm or 4 mm for example). In another measure the focus adjuster 62 provides an adequate result as long as most of the light that enters the transmitting member 71 at a bottom end is condensed within an area that defined by the radial width of the transmitting member 71.

The sensor 63 includes the light source 63a and a light receiver 63b. The light source 63a includes an active source of light such as a red light emitting diode. The type of light emitted from the light source can be determined according to the material of the focus ring 35 and the transmitting member 71. The focus adjuster 62 adjusts the focus of light emitted from the light source 63a, and the light is emitted toward the lower surface position of the transmitting member 71 and the focus ring 35. The light receiver 63b receives reflected light that is emitted from the light source 63a and that returns to the sensor 63 side from the second placing surface 36e side via the transmitting member 71. The light receiver 63b converts the information on the received reflected light, such as the amount of light, into a transmittable form (e.g., digital or analog signal).

The connector 64 transmits the detection result of the sensor 63 such as the information on the reflected light received by the light receiver 63b to the controller 90. For example, the connector 64 is a transmission cable.

On the basis of the information on the reflected light received via the connector 64, the controller 90 detects whether a structure such as the focus ring 35 is disposed on the second placing surface 36e. For example, the controller 90 detects whether the focus ring 35 is disposed on the second placing surface 36e, on the basis of the amount of the reflected light.

The detector 60 need not be disposed directly below the transmitting member 71. The detector 60 may be placed at any position and have any configuration as long as the detector 60 can emit light toward the transmitting member 71 and the second placing surface 36e, and can receive the reflected light returned from the transmitting member 71. The specific configuration of the detector 60 is not particularly limited. For example, the detector 60 may be configured using a light emitting diode (LED), a condensing lens (focus lens), an optical fiber, and the like.

Prevention of Erroneous Detection

Ambient light is a problem in detecting light. In case of the substrate processing apparatus 10 illustrated in FIG. 2, the shower head 46 is disposed above the second placing surface 36e. Similar to the focus ring 35, the shower head 46 may be made of silicon, for example.

FIG. 3A is a diagram for explaining a state when straight light is reflected by the shower head 46. As illustrated in FIG. 3A, in a state when the focus ring 35 is not placed, it is assumed that straight light is emitted upward from below the stage 31 to detect the focus ring 35. In this case, the straight light (i.e., light rays that neither reflect off an exterior side-boundary of the transmitting member 71, nor completely or partially converge within the transmitting member) propagates directly through the transmitting member 71, passes through the second placing surface 36e, and reaches the shower head 46. The lower surface of the shower head 46 is disposed substantially parallel to the second placing surface 36e. Consequently, the straight light reflected by the lower surface of the shower head 46 is reflected toward the transmitting member 71 in a direction opposite to the direction from which the light has come.

Figure 3B:
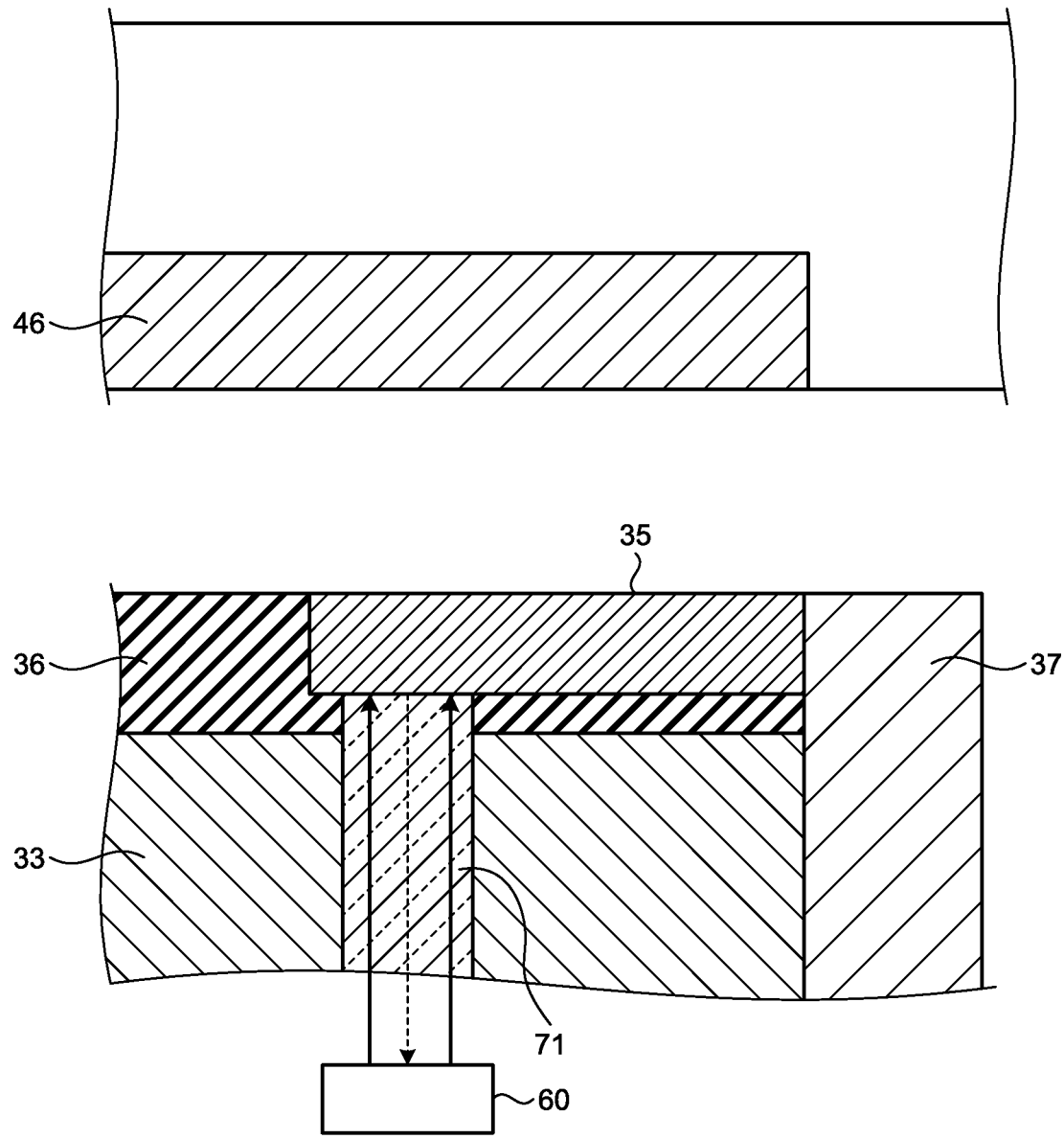
FIG. 3B is a diagram for explaining a state when straight light is reflected by a focus ring.

FIG. 3B is a diagram for explaining a state when straight light is reflected by the focus ring 35. Similar to FIG. 3A, the straight light is emitted upward from below the stage 31. In the example of FIG. 3B, the focus ring 35 is disposed on the second placing surface 36e. The straight light is reflected by the lower surface of the focus ring 35 and returns below the transmitting member 71.

As is evident from FIG. 3A and FIG. 3B, when the straight light is used for detecting the presence of the focus ring 35, the amount of light that is reflected by the shower head 46 and that reaches the light receiver 63b is substantially equal to the amount of light that is reflected by the focus ring 35 and that reaches the light receiver 63b. Thus, even when the focus ring 35 is not present on the second placing surface 36e, the focus ring 35 may be erroneously detected.

FIG. 3C is a diagram for explaining a state when light emitted from the sensor 63 is reflected by the shower head 46 in the substrate processing apparatus 10 according to the present embodiment. In the present embodiment, the light source 63a of the sensor 63 does not emit a straight light but emits light that is focused on the lower surface position of the focus ring 35, for example, on the position of the second placing surface 36e. Consequently, as illustrated in FIG. 3C, the light that has transmitted through the transmitting member 71 is condensed substantially on a central position of the through hole 70. When the focus ring 35 is not placed on the second placing surface 36e, the light reaches the shower head 46 while being diffused. Consequently, the amount of light that has reached the shower head 46, reflected by the shower head 46, and returns to the transmitting member 71 is significantly reduced compared to that of the straight light illustrated in FIG. 3A.

Figure 3D:
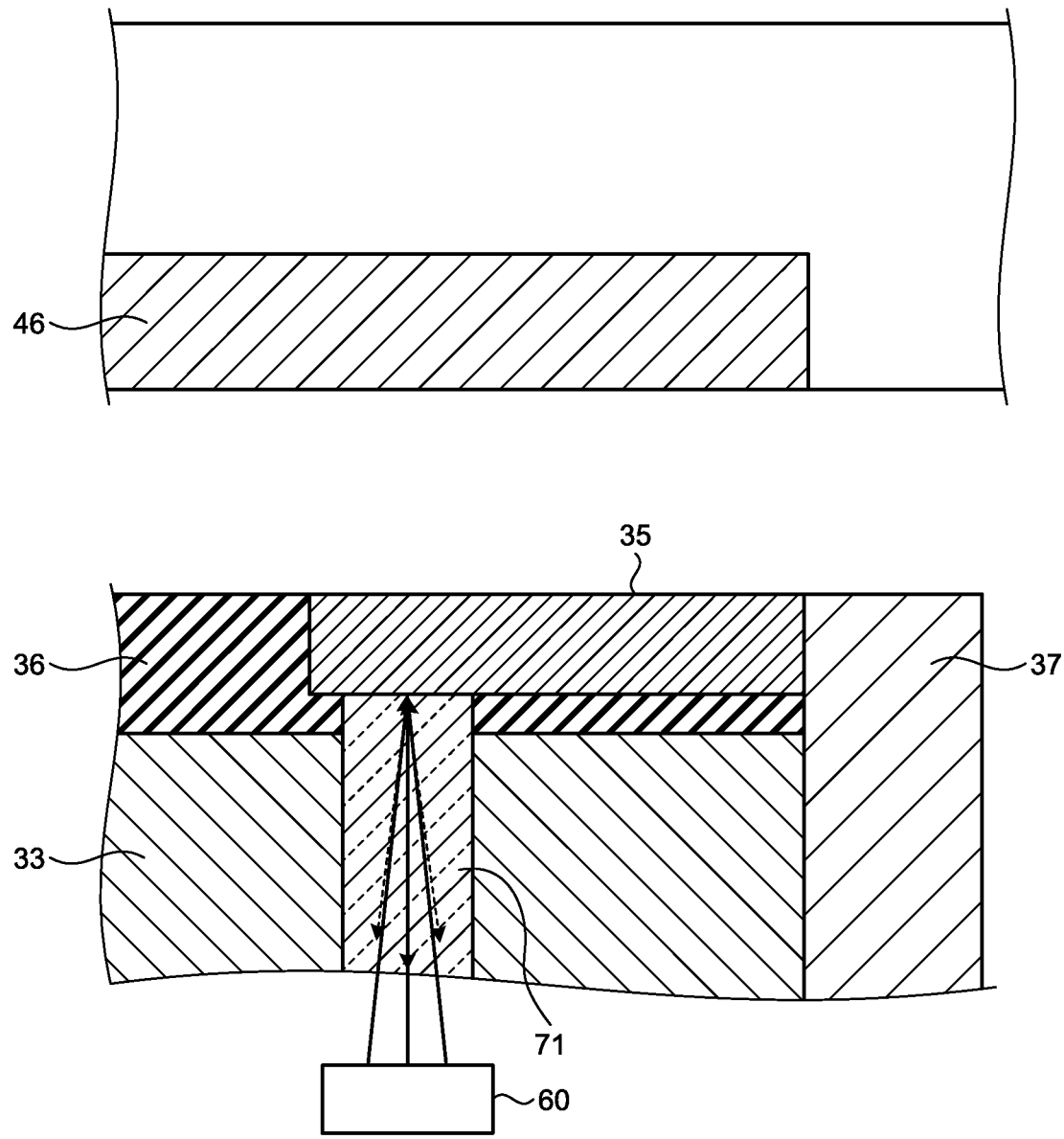
FIG. 3D is a diagram for explaining a state when light emitted from the sensor is reflected by a focus ring in the substrate processing apparatus according to the embodiment.

FIG. 3D is a diagram for explaining a state when light emitted from the sensor 63 is reflected by the focus ring 35 in the substrate processing apparatus 10 according to the embodiment. In the example in FIG. 3D, similar to FIG. 3C, the light emitted from the light source 63a of the sensor 63 is condensed on the lower surface position of the focus ring 35. When the focus ring 35 is disposed on the second placing surface 36e, the light that has transmitted through the transmitting member 71 and that is condensed substantially on a central position of the through hole 70 is reflected by the focus ring 35 and returns below the transmitting member 71. In this process, the amount of light reflected by the focus ring 35 is substantially the same as that in FIG. 3B. Thus, when FIG. 3C and FIG. 3D are compared, there is a significant difference between the amounts of light received by the light receiver 63b of the sensor 63. Consequently, the sensor 63 can detect the presence of the focus ring 35 on the basis of the amount of light received by the light receiver 63b.

Example of Flow of Detection Method

Figure 4:
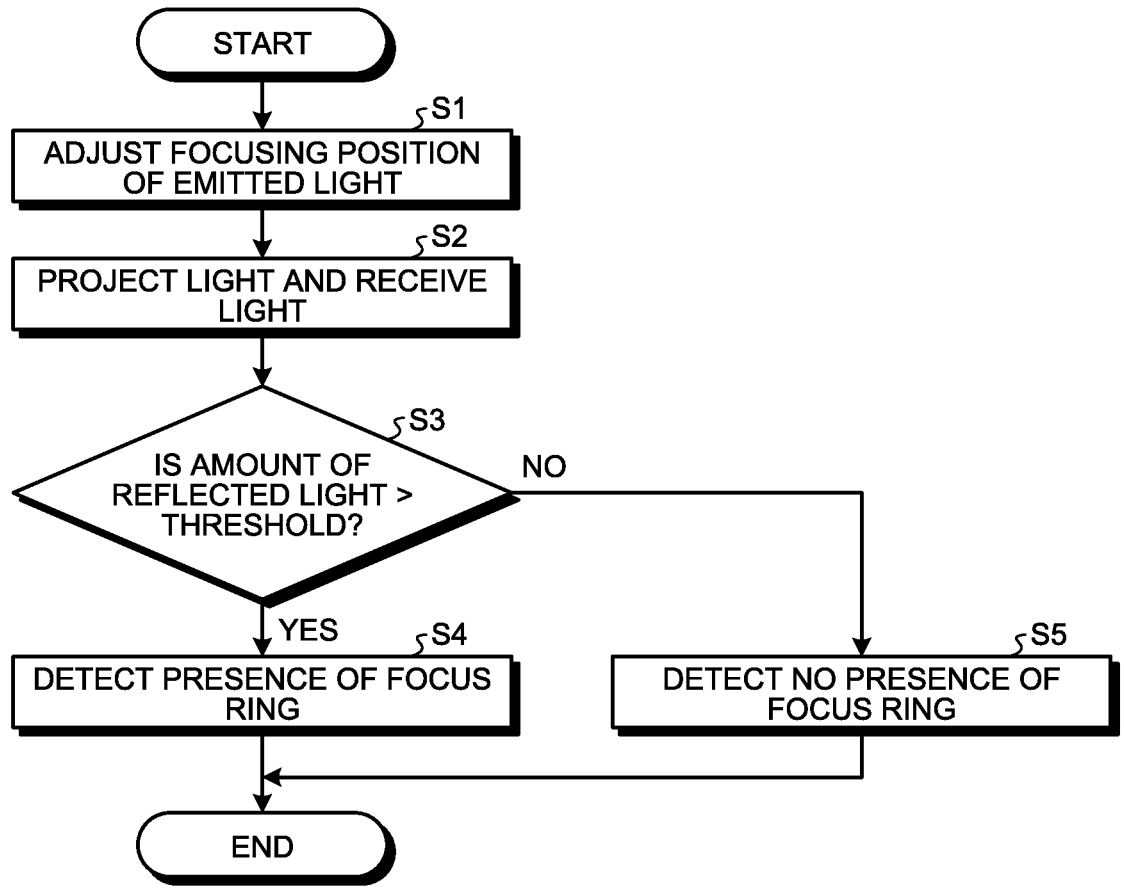
FIG. 4 is a flowchart illustrating an exemplary flow of focus ring detection in the substrate processing apparatus according to the embodiment.

FIG. 4 is a flowchart illustrating an exemplary flow of focus ring 35 detection in the substrate processing apparatus 10 according to the embodiment.

First, the focus adjuster 62 adjusts a focusing position of light emitted from the light source 63a (step S1).

The light source 63a of the sensor 63 projects (emits) light, and the light receiver 63b receives the reflected light (step S2).

The sensor 63 transmits information on the light (e.g., intensity or amount) received by the light receiver 63b to the controller 90. On the basis of the information on the light received by the light receiver 63b, the controller 90 determines whether the focus ring 35 is placed on the second placing surface 36e. For example, the controller 90 determines whether the amount of the received light exceeds a predetermined threshold (step S3). When the amount of light exceeds the predetermined threshold (Yes at step S3), the controller 90 determines (detects) that the focus ring 35 is on the second placing surface 36e (step S4). On the other hand, when the amount of light is equal to or less than the predetermined threshold (No at step S3), the controller 90 determines (detects) that the focus ring 35 is not on the second placing surface 36e (step S5). Consequently, the process of detecting the focus ring 35 is finished.

In the above explanation, information is transmitted from the sensor 63 to the controller 90, and the controller 90 makes a determination (performs detection) regarding the presence or absence of the focus ring 35. However, it is not limited thereto, and the sensor 63 may make a determination (perform detection), and transmit the detection result to the controller 90.

Moreover, the controller 90 may be configured so as to detect an inclination of the focus ring 35 and the like, in addition to the presence of the focus ring 35, on the basis of the information collected about the received light. In this case, the substrate processing apparatus 10 detects information about a posture of the focus ring 35 in addition to the presence of the focus ring 35. Moreover, when the detector 60 is disposed on a plurality of locations on the stage 31 in the circumferential direction, the inclination of the focus ring 35 and the like can be detected more accurately.

Transmitting Member as a Lifter Pin

When a mechanism for automatically transferring the focus ring 35 is disposed in the substrate processing apparatus including the focus ring 35, a part of the transferring mechanism may be commonly used with the detector 60 described above. For example, the transmitting member 71 may be configured to double as a lifter pin capable of being lifted and lowered in the through hole 70. In this way, the transmitting member 71 serves dual purposes: lifter pin, and part of the scheme for detecting the focus ring 35. Then, the transmitting member 71 is connected to a drive assembly or driving mechanism (e.g., actuator, motor, and/or other device that controllably urges the transmitting member 71 forward and backward in the through hole 70) disposed below the stage 31. The detector 60 is disposed at a position deviated from the axis center of the through hole 70, and a mirror and the like is disposed so that the light emitted from the light source 63a passes through the lifter pin, in other words, the transmitting member 71 from below to above. Moreover, an optical element for receiving the reflected light is similarly disposed. With such a configuration, it is possible to dispose a mechanism for detecting the presence of the focus ring 35 in the stage 31 without forming a through hole 70 that is dedicated to the detector 60. Moreover, with this configuration it is possible to "re-use" the detector 60 to support multiple through holes and transmitting members. Consequently, it is possible to improve the utilization efficiency of the stage 31, and suppress footprint.

Shape of Focus Ring

Figure 5:
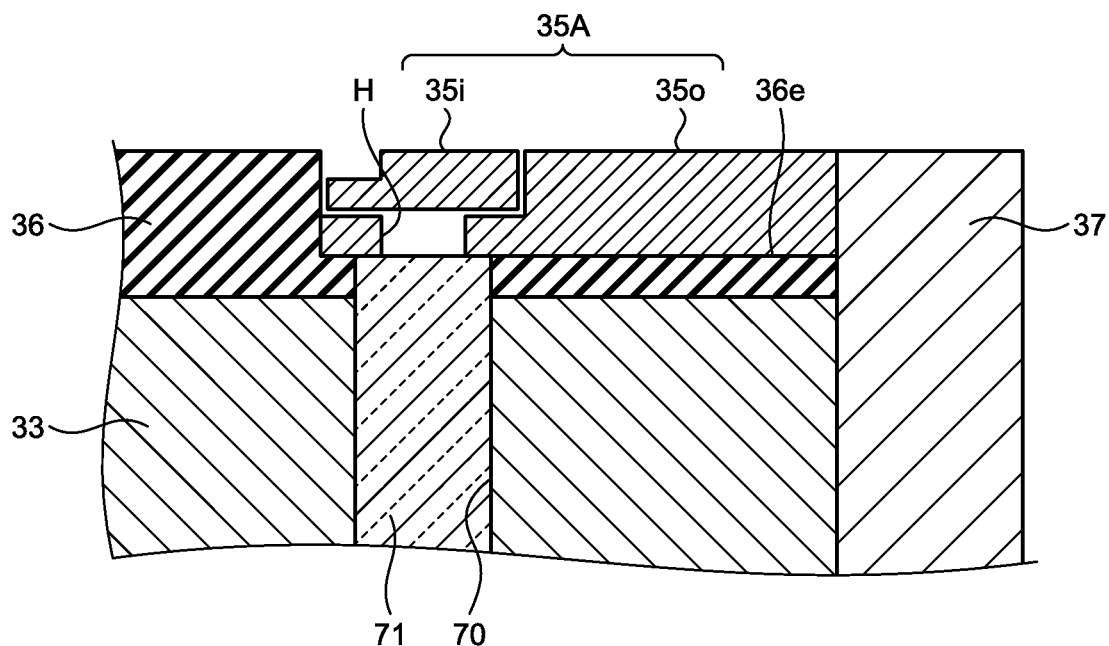
FIG. 5 is a diagram for explaining another exemplary focus ring applicable to the substrate processing apparatus of the embodiment.

The focus ring 35 in the substrate processing apparatus 10 illustrated in FIG. 1 is an annular, or ring-shaped member formed as a single part. However, it is not limited thereto, and the shape of the focus ring 35 may be modified in various ways. FIG. 5 is a diagram for explaining another exemplary focus ring applicable to the substrate processing apparatus 10 of an embodiment.

A focus ring 35A illustrated in FIG. 5 includes two ring members: a first ring member 35i and a second ring member 35o. The first ring member 35i is fitted onto the second ring member 35o at an inner periphery of the second ring member 35o. When the first ring member 35i is fitted to the second ring member 35o and made integral with the second ring member 35o, the first ring member 35i and the second ring member 35o collectively make a shape of one ring member. In FIG. 5, a notch is provided on the upper portion of the first ring member 35i at the inner peripheral side. However, the first ring member 35i may or may not include a notch. To detect the first ring member 35i of the focus ring 35A formed in this manner by the detector 60, a through hole H (a second through hole) is formed on the inner periphery of the second ring member 35o, where the second ring member 35o overlaps with the first ring member 35i. The second ring member 35o has a larger outer diameter than the first ring member 35i. When the focus ring 35A is placed on the second placing surface 36e, the through hole H is disposed so that the through hole H communicates with the through hole 70 (first through hole) formed on the second placing surface 36e. By configuring in this manner, the detector 60 can focus the light from the light source 63a to a lower surface position, which is a position of the lower surface of the first ring member 35i, and detect the presence of the first ring member 35i. Moreover, when an additional through hole is formed on the position that reaches the lower surface of the second ring member 35o, it is possible to detect the first ring member 35i and the second ring member 35o separately.

Figure 6:
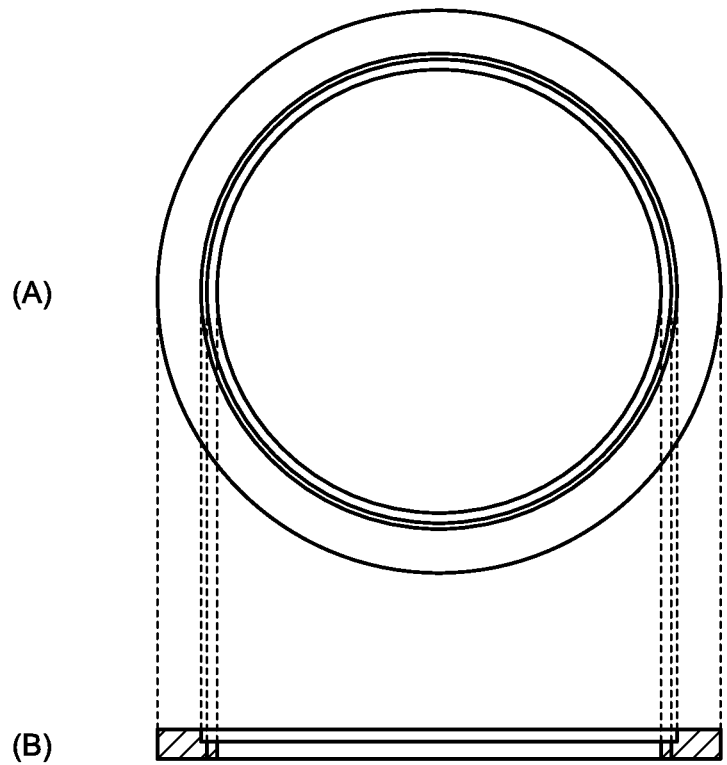
FIG. 6 is a diagram for explaining another exemplary focus ring applicable to the substrate processing apparatus of the embodiment.
Figure 7:
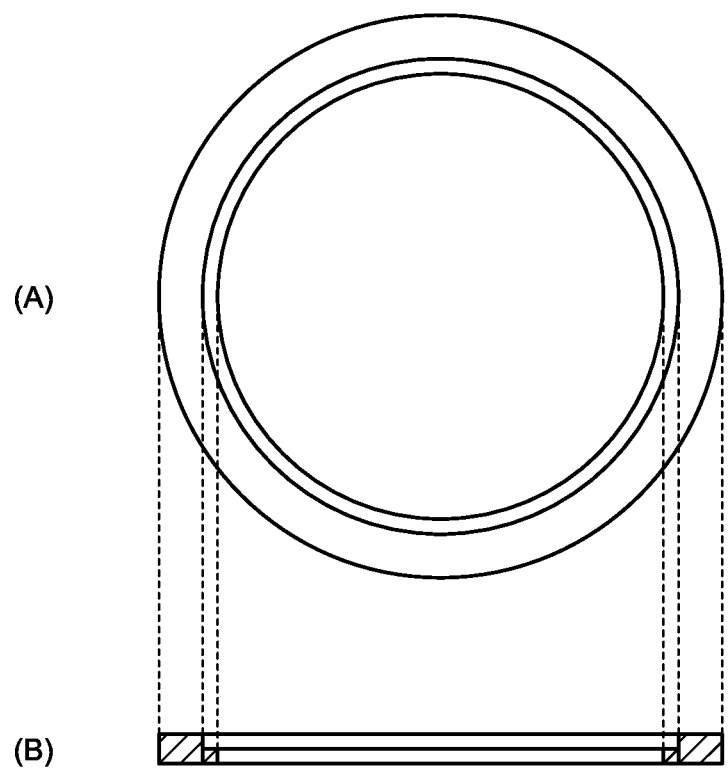
FIG. 7 is a diagram for explaining still another exemplary focus ring applicable to the substrate processing apparatus of the embodiment.
Figure 8:
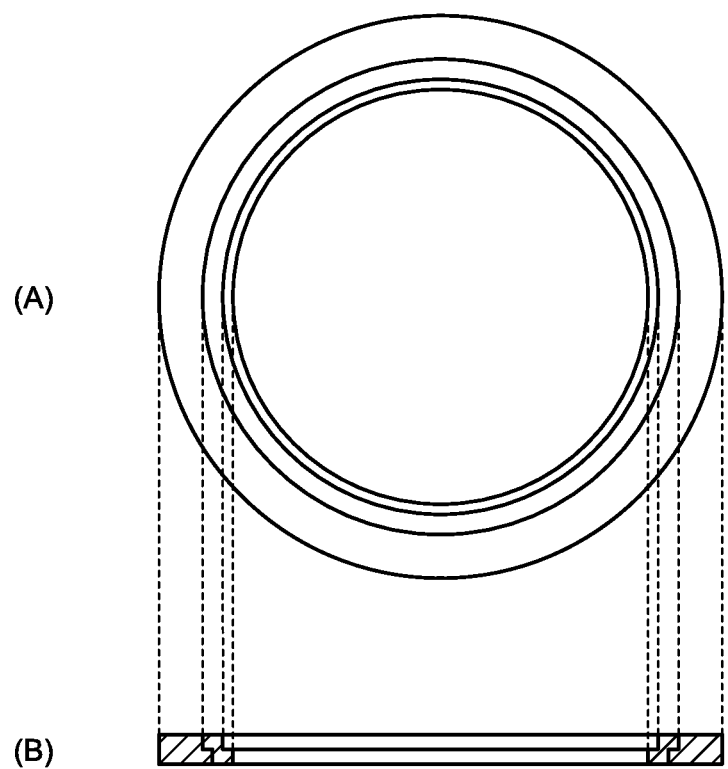
FIG. 8 is a diagram for explaining still another exemplary focus ring applicable to the substrate processing apparatus of the embodiment.

FIG. 6 to FIG. 8 are diagrams for explaining another exemplary focus ring applicable to the substrate processing apparatus 10 of the embodiment. In addition to the example illustrated in FIG. 5, as illustrated in FIG. 6, the cross section of the focus ring may be formed in an inverted L-shape in which the upper surface of the focus ring at the inner peripheral side is recessed, and the inside and outside of the focus ring may be separately formed. Moreover, as illustrated in FIG. 7, the inner peripheral side ring and the outer peripheral side ring may be configured separately, and the thickness of the inner peripheral side ring may be made thinner than that of the outer peripheral side ring. Furthermore, as illustrated in FIG. 8, the inner peripheral side ring and the outer peripheral side ring may be partially overlapped. In any case, it is possible to detect the presence of a part of the focus ring, by adjusting the light emitted from the detector 60 to be focused on the lower surface position of the focus ring.

The configuration and position of the detector 60 are not limited to those illustrated in the diagram. For example, in FIG. 2, the detector 60 is disposed below the base 33 (in the stage 31). However, the position of the detector 60 is not limited thereto. Moreover, the configuration of the detector 60 is not limited to that illustrated in FIG. 2, as long as an optical path can be disposed by utilizing the space in the electrostatic chuck 36 and the base 33.

Effects of Embodiment

As described above, the substrate processing apparatus according to the embodiment includes a stage, a light source, a focus adjuster, a light receiver, and a controller. The stage includes a first placing surface on which the base is to be placed and a second placing surface that surrounds the first placing surface and on which the focus ring is to be placed. The focus adjuster condenses light from the light source on the lower surface position of the focus ring placed on the second placing surface. The light receiver receives light from the lower surface position of the focus ring. The controller detects the presence of the focus ring on the second placing surface, on the basis of the light received by the light receiver. Thus, compared to when straight light is emitted on the second placing surface, it is possible to detect the presence of the focus ring. Consequently, with the embodiment, it is possible to detect the focus ring disposed on the stage.

Moreover, the substrate processing apparatus according to the embodiment further includes a first through hole that is opened on the second placing surface and that penetrates through the stage, and a transmitting member that is disposed in the first through hole and that transmits light. The focus adjuster then focuses the light from the light source on the lower surface position of the focus ring via the transmitting member disposed inside the through hole. Consequently, with the embodiment, it is possible to dispose a mechanism for detecting the presence of a focus ring, without adding a part on the position exposed to the processing space inside the substrate processing apparatus.

Furthermore, in the substrate processing apparatus according to the embodiment, the transmitting member is a member made of sapphire or quartz. Consequently, a process using plasma can be executed in the processing space.

Still furthermore, in the substrate processing apparatus according to the embodiment, the light receiver receives the reflected light from the lower surface position of the focus ring. The controller detects that the focus ring is present when the amount of the received reflected light exceeds a threshold, and detects that the focus ring is not present when the amount of the received reflected light is equal to or less than the threshold. Consequently, with the present embodiment, it is possible to detect the presence of the focus ring without performing a complicated detection process.

Still furthermore, in the substrate processing apparatus according to the embodiment, the transmitting member seals the first through hole. Consequently, it is possible to separate the processing space from the space below the stage.

Still furthermore, in the substrate processing apparatus according to the embodiment, the transmitting member is a lifer pin capable of reciprocating movement along a direction orthogonal to the second placing surface. Thus, with the embodiment, it is possible to dispose a mechanism for detection, without increasing the volume of the stage. Consequently, it is possible to implement a detection mechanism while suppressing an increase in footprint.

Still furthermore, in the substrate processing apparatus according to the embodiment, there are a plurality of the first through holes, and one light receiver is disposed in each of the first through holes. Consequently, with the embodiment, it is possible to detect the presence of the focus ring at a plurality of positions, and acquire additional information such as inclination of the focus ring according to difference in the amount of received light.

Still furthermore, the substrate processing apparatus according to the embodiment may also include a focus ring formed of two or more ring members partially overlapping with each other in the vertical direction. At least one of the two or more ring members has a second through hole that communicates with the first through hole and that is closed by the other of the two or more ring members, when the focus ring is disposed on the second placing surface. The focus adjuster may also focus the light from the light source on the lower surface position, which is a position of a lower surface of another of the two or more ring members. With such a configuration, even when the focus ring is configured by two or more ring members, it is possible to detect the presence of the ring member disposed above.

Still furthermore, the substrate processing apparatus according to the embodiment further includes an opposing member. The opposing member is disposed opposed to the second placing surface above the second placing surface, and made of the same material as that of the focus ring. Even when the opposing member is disposed, as described above, the light from the light source is condensed on the second placing surface by the focus adjuster. Thus, it is possible to prevent erroneous detection caused by ambient light. In the substrate processing apparatus according to the embodiment, the opposing member may be a shower head made of silicon.

Still furthermore, in the method for detecting the presence of a focus ring on the stage according to the embodiment, the light from the light source is focused on the lower surface position of the focus ring placed on the second placing surface of the stage that includes the first placing surface on which the substrate is to be placed, and the second placing surface that surrounds the first placing surface and on which the focus ring is to be placed. Then, the method detects the presence and absence of the focus ring on the second placing surface, by receiving the light from the lower surface position of the focus ring, and on the basis of the received light. Thus, compared to when the straight light is emitted on the second placing surface, it is possible to accurately detect the presence of the focus ring. Consequently, with the embodiment, it is possible to detect the focus ring disposed on the stage.

Still furthermore, in the method according to the embodiment, the light from the light source is focused on the lower surface position of the focus ring via the transmitting member that is disposed in the first through hole being opened on the second placing surface and penetrating through the stage, and that transmits light. The method of the embodiment detects the presence of the focus ring on the second placing surface according to the amount of received light. Consequently, with the embodiment, it is possible to detect the presence of the focus ring, without adding a part on the position exposed to the processing space inside the substrate processing apparatus.

According to the present disclosure, it is possible to detect the presence of the focus ring disposed on the stage.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An apparatus for processing a substrate, the apparatus comprising:
   a stage that includes a first placing surface on which a substrate is to be placed and a second placing surface that surrounds the first placing surface and on which a focus ring is to be placed;
   a light source;
   an optical assembly that adjustably focuses light from the light source substantially on a lower surface position, which is a position of a lower surface of the focus ring once placed on the second placing surface;
   a light receiver that receives light from the lower surface position;
   controller circuitry configured to detect at least one of a presence of the focus ring and an absence of the focus ring on the second placing surface, based on the light received by the light receiver;
   a first through hole that is open on one end to the second placing surface and that penetrates through the stage; and
   an optical channel structure that is disposed in the first through hole and through which the light passes, wherein
   the optical assembly focuses light from the light source on the lower surface position via the optical channel structure disposed in the first through hole, the light receiver receives reflected light from the lower surface position, and the controller circuitry detects that the focus ring is present when an amount of received light exceeds a threshold, and detects that the focus ring is not present when the amount of received light is equal to or less than the threshold.

2. The apparatus according to claim 1, wherein the optical channel structure is made of sapphire or quartz.

3. The apparatus according to claim 1, wherein the optical channel structure seals the first through hole.

4. The apparatus according to claim 1, wherein the optical channel structure is a lifter pin disposed in the first through hole to permit reciprocating movement along a direction orthogonal to the second placing surface.

5. The apparatus according to claim 4, further comprising:
a drive assembly that controls the reciprocating movement of the lifter pin.

6. The apparatus according to claim 1, further comprising:
another light receiver, wherein
the stage includes another first through hole with another optical channel structure, and
the another light receiver is disposed to receive light from the another optical channel.

7. The apparatus according to claim 1, further comprising:
the stage includes another first through hole with another optical channel structure, and
the light receiver is configured to receive light from the optical channel structure and the another optical channel structure.

8. The apparatus according to claim 1, wherein
the optical assembly includes an objective lens.

9. The apparatus according to claim 1, further comprising:
the focus ring, the focus ring including two or more ring members partially overlapping with each other in a vertical direction, wherein
at least one of the two or more ring members includes a second through hole that communicates with the first through hole under a condition that the focus ring is disposed on the second placing surface, and that is closed by another of the two or more ring members, and
the optical assembly focuses light from the light source on a lower surface position, which is a position of a lower surface of another of the two or more ring members.

10. The apparatus according to claim 1, further comprising:
an opposing structure that faces the second placing surface and is disposed over the second placing surface, the opposing structure being made of a same material as the focus ring.

11. The apparatus according to claim 10, wherein the opposing structure is a shower head made of silicon.

12. A controller in an apparatus for processing a substrate, the controller comprising:
circuitry configured to
control an optical assembly to focus light from a light source substantially on a lower surface portion of a focus ring once disposed on a second placing surface of a stage, the second placing surface surrounding a first placing surface of the stage on which a substrate is to be placed;
receive light that returns through an optical channel structure disposed in a through hole formed in the stage, the through hole being opened to the second placing surface; and
detect at least one of a presence of the focus ring and an absence of the focus ring on the second placing surface, based on the light received, wherein
the circuitry is configured to detect that the focus ring is present when an amount of received light exceeds a threshold, and detects that the focus ring is not present when the amount of received light is equal to or less than the threshold.

13. The controller of claim 12, wherein
the circuitry is configured to focus the light on the lower surface position via the optical channel structure.

14. The controller of claim 12, wherein
the circuitry is further configured to drive a reciprocating movement of the optical channel structure, wherein the optical channel structure also serves as a lifting pin.

15. The controller of claim 12, wherein
the stage includes another through hole with another optical channel structure, and
the circuitry is configured to receive light from the optical channel structure and the another optical channel structure, and detect a posture of the focus ring based on the light received from the optical channel structure and the another optical channel.

\* \* \* \* \*